United States Patent
Ikeda

(10) Patent No.: US 7,994,852 B2
(45) Date of Patent: Aug. 9, 2011

(54) ELECTRONIC CIRCUIT AND ELECTRONIC DEVICE

(75) Inventor: Masayuki Ikeda, Shiojiri (JP)

(73) Assignee: Seiko Epson Corporation (JP)

( * ) Notice: Subject to any disclaimer, the term of this patent is extended or adjusted under 35 U.S.C. 154(b) by 45 days.

(21) Appl. No.: 12/619,923

(22) Filed: Nov. 17, 2009

(65) Prior Publication Data

US 2010/0127770 A1    May 27, 2010

(30) Foreign Application Priority Data

Nov. 26, 2008  (JP) ................. 2008-300526

(51) Int. Cl.
H03D 1/00 (2006.01)
H03D 1/18 (2006.01)

(52) U.S. Cl. ............... 329/353; 329/363; 329/364

(58) Field of Classification Search .......... 329/347, 329/349, 353, 363–366, 369; 327/50; 455/337
See application file for complete search history.

(56) References Cited

U.S. PATENT DOCUMENTS 6,160,448 A * 12/2000 Werrbach ............ 330/124 R
2005/0206446 A1  9/2005 Shimazaki et al.

FOREIGN PATENT DOCUMENTS

| JP | 4-170807 | 6/1992 |
|----|----------|--------|
| JP | 2004-320083 | 11/2004 |
| JP | 2005-252740 | 9/2005 |

OTHER PUBLICATIONS

"A CMOS Impulse Radio Ultra-Wideband Tranceiver for 1 Mb/s Data Communication and ±2.5cm Range Findings", T. Terada et al, 2005 Symposium on VLSI Circuits Digest of Technical Papers, pp. 30-33.

* cited by examiner

*Primary Examiner* — David Mis
(74) *Attorney, Agent, or Firm* — Harness, Dickey & Pierce, P.L.C.

(57) ABSTRACT

An electronic circuit includes: a circuit generating first and second balanced differential input signals; a first envelope detection circuit including a first output terminal and first and second input terminals receiving the first and second input signals, respectively, via first and second impedance elements, and outputs from the first output terminal a first output signal that is the sum of the squares of the first and second input signals; a second envelope detection circuit including a second output terminal and third and fourth input terminals receiving the first and second input signals, respectively, via third and fourth impedance elements, respectively, and outputs from the second output terminal a second output signal that is twice the value obtained by squaring the average of the first and second input signals; and a differential circuit generating a differential signal from the first and second output signals.

7 Claims, 7 Drawing Sheets

US 7,994,852 B2

ELECTRONIC CIRCUIT AND ELECTRONIC DEVICE

BACKGROUND

1. Technical Field

The present invention relates to an electronic circuit and an electronic device including an electronic circuit, more particularly, an electronic device that receives a UWB (Ultra Wide Band) signal.

2. Related Art

Circuits that detect an envelope of a received signal to demodulate a baseband signal have been used since a long time ago, and various kinds of the circuits have been devised. An envelope is a curve connecting peak value of a signal and can be obtained by smoothing the absolute value of the AC component. Instead of the envelope detection, there has also been a method of squaring and smoothing a signal since a long time ago, which is called "square-law detection" or the like. For example, JP-A-4-170807 describes a square-law detector circuit that obtains the square value of a signal and an amplitude detection method using the square-law detector circuit.

In a UWB communication through UWB signals, especially through IR (Impulse Radio) not using a carrier wave (hereinafter referred to as "UWB-IR" communication), there is a receiver using the envelope detection. For example, JP-A-2004-320083 or JP-A-2005-252740 describes the effectiveness of the envelope detection. In JP-A-2004-320083 or JP-A-2005-252740, a rectifier circuit and an integrator circuit are used for smoothing the absolute value of the AC component of a signal to determine the envelope. Hereinafter, an operation detecting the envelope of a modulated carrier wave (high-frequency signal that changes in amplitude with the lapse of time) is referred to as "envelope detection". An example of using the square-law detection in a UWB-IR receiver cannot be found.

"A CMOS IMPULSE RADIO ULTRA-WIDEBAND TRANCEIVER FOR 1 Mb/s DATA COMMUNICATION AND ±2.5 cm RANGE FINDINGS" T. Terada et. al, 2005 Symposium on VLSI Circuits Digest of Technical Papers, PP. 30-33, discloses a technique for reducing the power consumption of a device by cutting off a power supply in a transmitting and receiving circuit when there is no signal because a UWB-IR signal is intermittent.

However, when attempting to reduce the power consumption of equipment by utilizing the intermittency of the signal in a UWB-IR receiver, there arises a considerable difficulty. FIG. 7 is a circuit diagram for explaining a problem in the related-art. FIG. 8 is a timing diagram for explaining the problem in the related-art.

As shown in FIG. 7, a related-art electronic circuit 7 includes a low noise amplifier (LNA) 100 that can perform switching operation and an envelope detection circuit 200.

The LNA 100 includes a cascode amplifier circuit composed of an inductor 107, a resistance 105, and NMOS transistors 103 and 101 connected in series between a power supply voltage line vdd and a ground potential line, and an inductor 108, a resistance 106, and NMOS transistors 104 and 102 connected in series between the power supply voltage line vdd and the ground potential line. The LNA 100 further includes a capacitor 109 and an inductor 110 connected in series between an input terminal In1 and the gate terminal of the NMOS transistor 101, a capacitor 112 and an inductor 113 connected in series between an input terminal In2 and the gate terminal of the NMOS transistor 102, a resistance 111 connected between a bias voltage terminal bs1 and the connecting line of the capacitor 109 and the inductor 110, and a resistance 114 connected between the bias voltage terminal bs1 and the connecting line of the capacitor 112 and the inductor 113. The gate terminals of the NMOS transistors 103 and 104 are connected to an input terminal bs0.

The LNA 100 amplifies balanced differential signals a1 and a2 input to the input terminals In1 and In2 and outputs differential signals c1 and c2 respectively from an output line 115 connected to the connecting line of the inductor 108 and the resistance 106 and from an output line 116 connected to the connecting line of the inductor 107 and the resistance 105.

The LNA 100 can control current flowing into the LNA 100 by controlling a voltage Vb applied to the input terminal bs0. That is, when the voltage Vb is set to a voltage value (L level) lower than the threshold voltage of the NMOS transistors 103 and 104, the NMOS transistors 103 and 104 are cut off. Therefore, the current flowing into the LNA 100 is zero. On the other hand, when the voltage Vb is set to a bias voltage value (H level) that is higher than the threshold voltage of the NMOS transistors 103 and 104 and at which the NMOS transistors 103 and 104 start to operate as a cascode stage, the LNA 100 starts to operate as a cascode amplifier circuit. The resistances 105 and 106 are used for stabilizing the LNA 100. Current signals amplified by the cascode stage are converted to voltages by the inductors 107 and 108 and output as differential outputs from the output lines 115 and 116 as the differential signals c1 and c2.

The envelope detection circuit 200 includes a cascode amplifier circuit composed of PMOS transistors 211 and 213 connected in series between the power supply voltage line vdd and the ground potential via a NMOS transistor 216 and PMOS transistors 212 and 214 connected in series between the power supply voltage line vdd and the ground potential via the NMOS transistor 216.

The gate terminal of the NMOS transistor 216 is connected to a bias voltage terminal bs2 and outputs a square sum signal $e=c1^2+c2^2$ of the differential signals c1 and c2 output from the output lines 115 and 116 of the LNA 100 from the output line 215 connected to the drain terminal of the NMOS transistor 216 and the drain terminals of the PMOS transistors 213 and 214 and an output terminal Out. The gate terminals of the PMOS transistors 213 and 214 are connected to a bias voltage terminal bs3. The gate terminal of the PMOS transistor 211 is connected to the output line 115 via a capacitor 121. The gate terminal of the PMOS transistor 212 is connected to the output line 116 via a capacitor 122. The gate terminal of the PMOS transistor 211 is connected to a bias voltage terminal bs4 via a resistance 217. The gate terminal of the PMOS transistor 212 is connected to the bias voltage terminal bs4 via a resistance 218.

When the PMOS transistors 213 and 214 are biased by a voltage applied to the bias voltage terminal bs3 and are operating in the saturated region, drain currents Id1 and Id2 respectively flowing into the PMOS transistors 211 and 212 are as follows:

$$Id1=(\tfrac{1}{2})\beta(Vbs4+v1-Vt)^2 \qquad (1)$$

$$Id2=(\tfrac{1}{2})\beta(Vbs4+v2-Vt)^2 \qquad (2)$$

where v1 and v2 are the AC components of voltages of the differential signals c1 and c2, respectively; Vbs4 is the bias voltage applied by the bias voltage terminal bs4; Vt is the threshold voltage of the PMOS transistors 211 and 212; W is the channel width; L is the channel length; μ is the carrier mobility; C is the gate capacitance per unit area; and β=μC (W/L) is the proportional constant. The total current of Id1 and Id2 flows into a current source load as the transistor 216 and can be converted to a large voltage signal to be extracted.

When v1=v0 and v2=−v0 on the assumption that the differential signals c1 and c2 are ideal balanced signals having no in-phase component, the following equation is given.

$$I0 = Id1 + Id2 = \beta\{v0^2 + (Vbs4 - Vt)^2\} \quad (3)$$

The PMOS transistors 213 and 214 decrease the change of drain voltage of the PMOS transistors 211 and 212 and prevent the decrease of drain current (drain current looks like decreasing in terms of equivalence) of the PMOS transistors 211 and 212 by a phenomenon called channel length modulation, thereby acting to enhance the accuracy of Equation (3).

Since $(Vbs4-Vt)^2$ on the right side of Equation (3) is the DC component, when only the amount of change is extracted, the square value of the input signal v0 input to the envelope detection circuit 200 can be extracted. The DC component of $(Vbs4-Vt)^2$ can be easily removed by the capacitors 121 and 122. Only the DC component that can be easily removed is left as an error term even if any bias voltage Vbs4 is selected. Therefore, the PMOS transistors 211 and 212 can be set in a region where they can stably operate.

However, when attempting to cause the LNA 100 to perform the switching operation with the voltage Vb applied to the input terminal bs0, the differential signals c1 and c2 output by the LNA 100 do not become ideal balanced signals, and a large in-phase component is mixed thereto as noise. Therefore, noise cannot be removed.

With reference to FIG. 8, the case where the LNA 100 performs switching operation will be described.

As shown in FIG. 8, differential signals a1 and a2 indicating data "1" (with pulses) are first input during time points t0 to t1. When the voltage Vb to be applied to the input terminal bs0 is changed from the L level to the H level at the time point to, a noise n0 occurs in the differential signals c1 and c2 output by the LNA 100. The noise n0 also occurs in the square sum signal e. Next, when the voltage Vb is changed from the H level to the L level for bringing the LNA 100 into a resting state during the time point t1 to a time point t2, a noise n1 occurs in the differential signals c1 and c2. The noise n1 also occurs in the square sum signal e. Next, the differential signals a1 and a2 indicating data "0" (no pulse) is input during the time point t2 to a time point t3. When the voltage Vb to be applied to the input terminal bs0 is changed from the H level to the L level at the time point t2, a noise n2 occurs in the differential signals c1 and c2 output by the LNA 100. The noise n2 also occurs in the square sum signal e.

In this manner, every time the LNA 100 performs the switching operation with the voltage Vb, the noise occurs. Therefore, the data of the differential signals a1 and a2 cannot be read correctly. That is, there is a problem that the switching operation of the LNA 100 for reducing the power consumption of the electronic circuit 7 leads to deterioration of sensitivity for signal reading.

SUMMARY

An advantage of some aspects of the invention is to solve the above problem and can be realized by the following embodiments or application examples.

First Application Example

A first application example of the invention is directed to an electronic circuit including: a circuit that generates a first input signal and a second input signal that are balanced differential signals; a first envelope detection circuit that includes a first input terminal, a second input terminal, and a first output terminal, the first input signal being input to the first input terminal via a first impedance element, the second input signal being input to the second input terminal via a second impedance element, and outputs from the first output terminal a first output signal that is the sum of the square of the first input signal and the square of the second input signal; a second envelope detection circuit that includes a third input terminal, a fourth input terminal, and a second output terminal, the first input signal being input to the third input terminal via a third impedance element, the second input signal being input to the fourth input terminal via a fourth impedance element, and outputs from the second output terminal a second output signal that is twice the value obtained by squaring the average of the first input signal and the second input signal; and a differential circuit that generates a differential signal from the first output signal and the second output signal.

According to the configuration, $v1^2+v2^2$ where v1 is the potential of the first input signal; and v2 is the potential of the second input signal can be obtained by the first envelope detection circuit, and $(v1+v2)^2/2$ can be obtained by the second envelope detection circuit. The difference between them is $(v1-v2)^2/2$. When v1=vc+vs and v2=vc−vs where vc is the in-phase component; and vs is the differential component (signal), the signal of the difference is $2vs^2$. Therefore, the in-phase noise component mixed due to switching operation can be removed to extract only the square value of the signal. The square detection of a UWB signal or the like can be performed by using this circuit.

Second Application Example

A second application example of the invention is directed to the electronic circuit of the first application example, wherein the first envelope detection circuit and the second envelope detection circuit have characteristics equal to each other, and each includes a first field effect transistor to whose gate terminal the first input signal is input and whose source terminal is connected to a first potential line, a second field effect transistor to whose gate terminal the second input signal is input and whose source terminal is connected to the first potential line, a third field effect transistor whose source terminal is connected to the drain terminal of the first field effect transistor and whose gate terminal is biased to a predetermined potential, a fourth field effect transistor whose source terminal is connected to the drain terminal of the second field effect transistor and whose gate terminal is biased to the predetermined potential, and an output line that connects the drain terminal of the third field effect transistor with the drain terminal of the fourth field effect transistor to output an output signal, and the second envelope detection circuit is short-circuited between the third input terminal and the fourth input terminal through a short-circuit line.

According to the configuration, the square value of a signal can be easily detected with high sensitivity due to the square-law characteristic of cascode-connected transistors. The electronic circuit can be configured with field effect transistors without using PN junction and therefore can be made on-chip by a typical CMOS semiconductor process. Since the circuit configuration is also extremely simple, and the electronic circuit can operate at a high speed and a high frequency of about the limit frequency of MOS transistors, the electronic circuit can be applied to a system that is required to operate at a high speed, such as IR communication. This makes it possible to realize an envelope detection circuit that is easily integrated into a system.

Third Application Example

A third application example of the invention is directed to an electronic circuit including: a circuit that generates a first input signal and a second input signal that are balanced differential signals; a first amplifier circuit that includes a first input terminal, a second input terminal, and a first output terminal, the first input signal being input to the first input terminal via a first impedance element, the second input signal being input to the second input terminal via a second impedance element, and outputs from the first output terminal a first output signal that is obtained by comparing the first input signal and the second input signal to select the larger one and amplifying the selected signal; a second amplifier circuit that includes a third input terminal, a fourth input terminal, and a second output terminal, the first input signal being input to the third input terminal via a third impedance element, the second input signal being input to the fourth input terminal via a fourth impedance element, outputs from the second output terminal a second output signal that is obtained by amplifying the average of the first input signal and the second input signal, and has characteristics equal to those of the first amplifier circuit; and a differential circuit that generates a differential signal from the first output signal and the second output signal.

According to the configuration, either the potential v1 of the first input signal or the potential v2 of the second input signal, whichever has a higher level (or lower level), can be obtained by the first amplifier circuit. That is, when v1=vc+vs and v2=vc−vs where vc is the in-phase component; and vs is the differential component (signal), the output of the first amplifier circuit can be expressed as vc+|vs| (or vc−|vs| when the potential having a lower level is obtained) (|vs| is the absolute value of vs). In addition, vc can be obtained by the second amplifier circuit. The difference between them is |vs|. This makes it possible to remove the in-phase noise component mixed due to switching or the like and extract only the absolute value of a signal. The envelope detection (full-wave rectification) of a UWB signal or the like can be performed by using this circuit.

Fourth Application Example

A fourth application example of the invention is directed to the electronic circuit of the third application example, wherein the first amplifier circuit and the second amplifier circuit have characteristics equal to each other, and each includes a first field effect transistor to whose gate terminal the first input signal is input and whose drain terminal is connected to a first potential line, a second field effect transistor to whose gate terminal the second input signal is input and whose drain terminal is connected to the first potential line, and an output line that connects the source terminal of the first field effect transistor with the source terminal of the second field effect transistor to output an output signal, and the second amplifier circuit is short-circuited between the third input terminal and the fourth input terminal through a short-circuit line.

According to the configuration, the absolute value of a signal can be easily detected with high sensitivity using the source follower connection of the first field effect transistor and the second field effect transistor that drive a common output load. The electronic circuit can be configured with field effect transistors without using PN junction and therefore can be made on-chip by a typical CMOS semiconductor process. Since the circuit configuration is also extremely simple, and the electronic circuit can operate at a high speed and a high frequency of about the limit frequency of MOS transistors, the electronic circuit can be applied to a system that is required to operate at a high speed, such as IR communication. This makes it possible to realize an envelope detection circuit that is easily integrated into a system.

Fifth Application Example

A fifth application example of the invention is directed to an electronic device including the electronic circuit of the fourth application example.

According to the configuration, the square value or absolute value of a signal can be easily detected by the electronic circuit. In addition, it is possible to realize a simple, low-power electronic device such as a receiver that uses the square-law detection or envelope detection.

Sixth Application Example

A sixth application example of the invention is directed to the electronic device of the fifth application example, further including a signal processing section that detects pulses carried by a supplied UWB signal.

According to the configuration, the square value or absolute value of a signal can be easily detected by the electronic circuit. It is especially possible to realize a simple, low-power electronic device with a receiver that detects pulses carried by a UWB signal.

Seventh Application Example

A seventh application example of the invention is directed to the electronic device of the sixth application example, further including a circuit portion to which power is supplied only when a UWB signal is present in at least a part thereof, and a switch circuit therefor.

According to the configuration, an in-phase noise due to the switching or the like of a circuit can be removed, and the square-law detection or envelope detection of a signal can be performed. Therefore, in receiving an intermittent pulse signal such as a UWB-IR signal, power supply of a circuit such as a low noise amplifier (LNA) of a receiver may be turned on only when a signal is (expected to be) present. In other times, power supply of the receiver can be turned off, so that the power consumption of the device can be greatly reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of an electronic circuit will be described in accordance with the drawings.

First Embodiment

Configuration of Electronic Circuit

Figure 1:
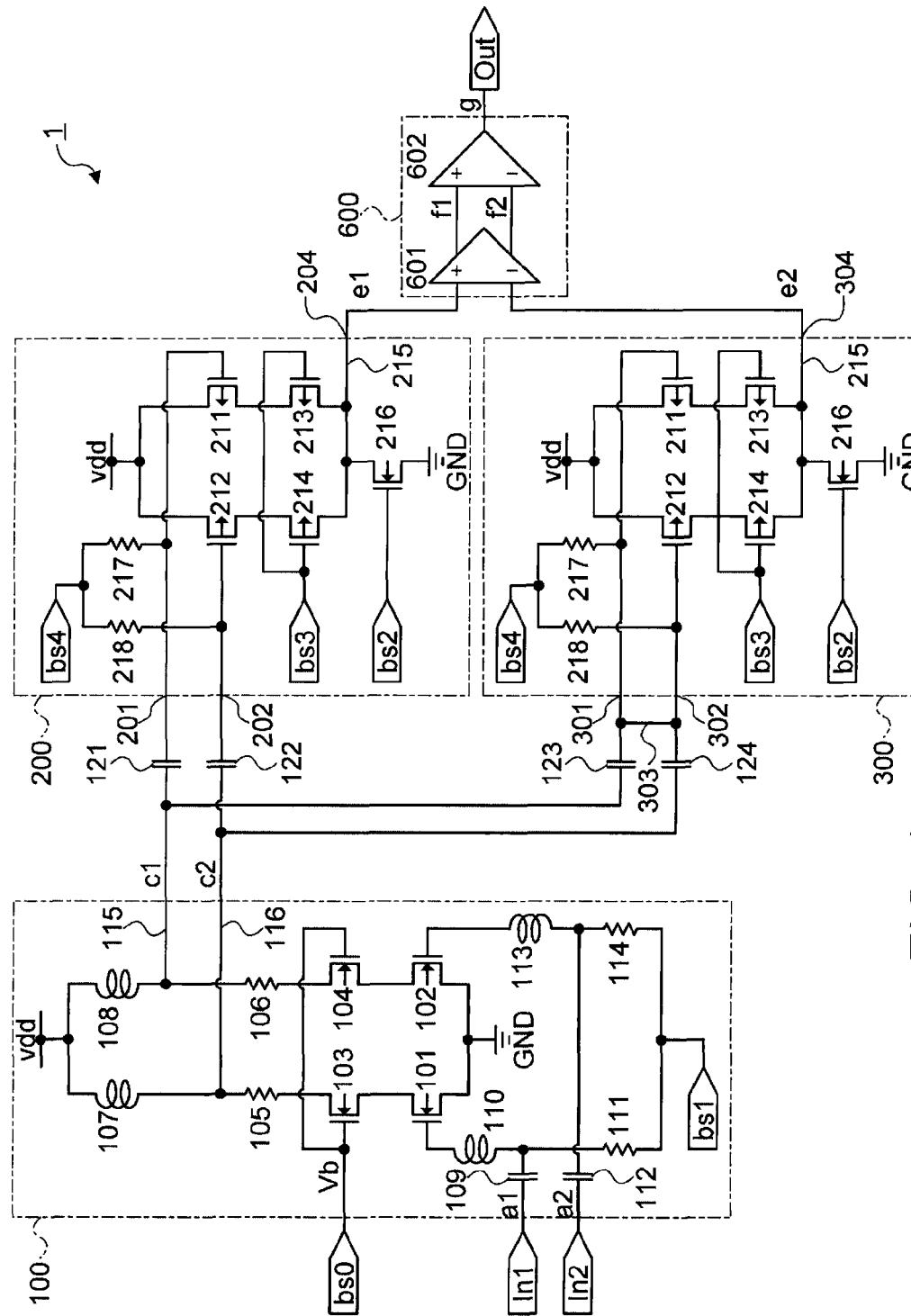
FIG. 1 is a circuit diagram showing the configuration of an electronic circuit according to a first embodiment.
Figure 2:
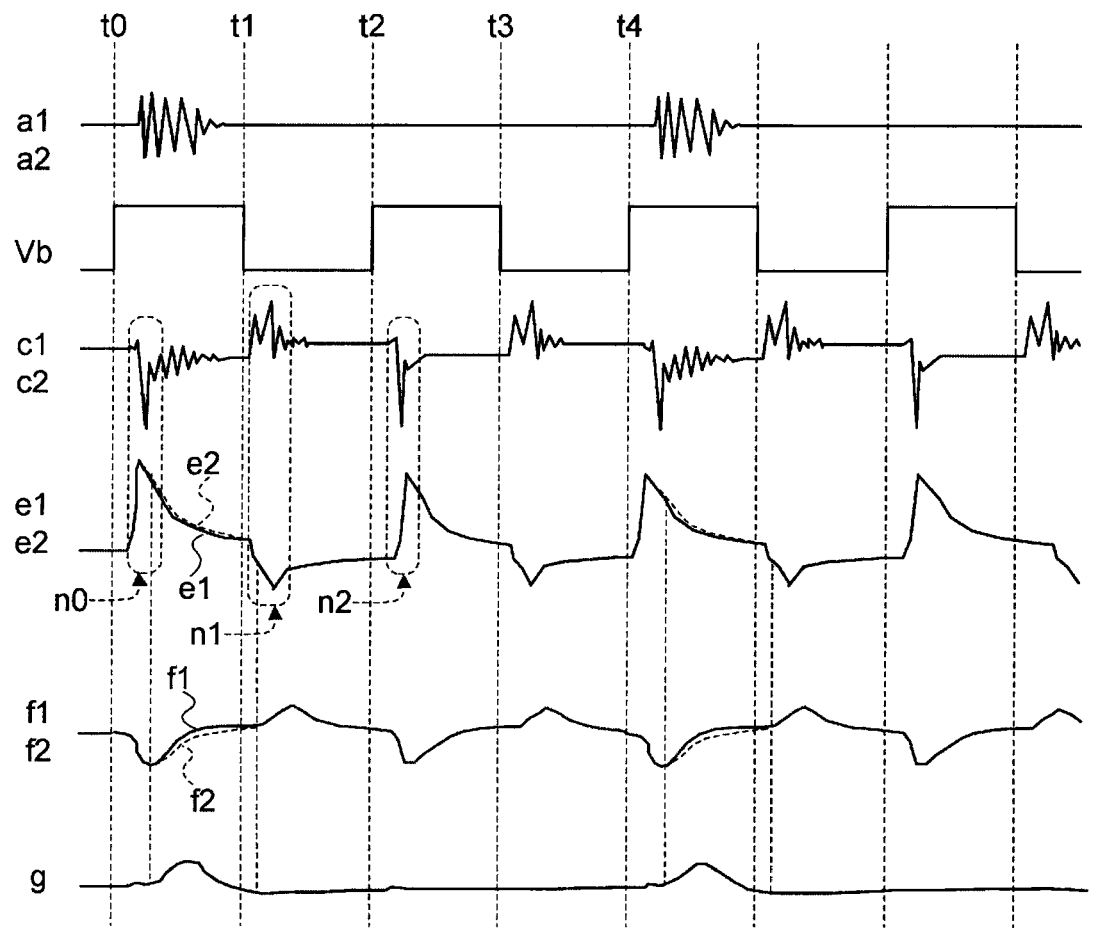
FIG. 2 is a waveform chart for explaining the operation of the electronic circuit according to the first embodiment.

The configuration of an electronic circuit according to a first embodiment will be first described with reference to FIGS. 1 and 2. FIG. 1 is a circuit diagram showing the configuration of the electronic circuit according to the first embodiment. FIG. 2 is a waveform chart explaining the operation of the electronic circuit according to the first embodiment.

As shown in FIG. 1, an electronic circuit 1 includes a low noise amplifier (LNA) 100 that can perform switching operation, an envelope detection circuit 200 as a first envelope detection circuit, an envelope detection circuit 300 as a second envelope detection circuit, and a differential circuit 600.

The LNA 100 includes a cascode amplifier circuit composed of an inductor 107, a resistance 105, and NMOS transistors 103 and 101 connected in series between a power supply voltage line vdd as a first potential line and a ground potential line GND, and an inductor 108, a resistance 106, and NMOS transistors 104 and 102 connected in series between the power supply voltage line vdd and the ground potential line GND. The LNA 100 further includes a capacitor 109 and an inductor 110 connected in series between an input terminal In1 and the gate terminal of the NMOS transistor 101, a capacitor 112 and an inductor 113 connected in series between an input terminal In2 and the gate terminal of the NMOS transistor 102, a resistance 111 connected between a bias voltage terminal bs1 and the connecting line of the capacitor 109 and the inductor 110, and a resistance 114 connected between the bias voltage terminal bs1 and the connecting line of the capacitor 112 and the inductor 113. The gate terminals of the NMOS transistors 103 and 104 are connected to an input terminal bs0.

The LNA 100 amplifies balanced differential signals a1 (first input signal) and a2 (second input signal) input to the input terminals In1 and In2 and outputs differential signals c1 and c2 respectively from an output line 115 connected to the connecting line of the inductor 108 and the resistance 106 and from an output line 116 connected to the connecting line of the inductor 107 and the resistance 105.

The LNA 100 can control current flowing into the LNA 100 by controlling a voltage Vb applied to the input terminal bs0. That is, when the voltage Vb is set to a voltage value (L level) lower than the threshold voltage of the NMOS transistors 103 and 104, the NMOS transistors 103 and 104 are cut off. Therefore, the current flowing into the LNA 100 is zero. On the other hand, when the voltage Vb is set to a bias voltage value (H level) that is higher than the threshold voltage of the NMOS transistors 103 and 104 and at which the NMOS transistors 103 and 104 start to operate as a cascode stage, the LNA 100 starts to operate as a cascode amplifier circuit. The resistances 105 and 106 are used for stabilizing the LNA 100. Current signals amplified by the cascode stage are converted to voltages by the inductors 107 and 108 and output as differential outputs from the output lines 115 and 116 as the differential signals c1 and c2.

The envelope detection circuit 200 includes a first input terminal 201, a second input terminal 202, and a first output terminal 204. The differential signal c1 as the first input signal is input to the first input terminal 201 via a capacitor 121 as a first impedance element. The differential signal c2 as the second input signal is input to the second input terminal 202 via a capacitor 122 as a second impedance element. The envelope detection circuit 200 outputs a first output signal e1 ($=c1^2+c2^2$) that is the sum of the square of the differential signal c1 and the square of the differential signal c2 from the first output terminal 204.

The envelope detection circuit 300 includes a third input terminal 301, a fourth input terminal 302, and a second output terminal 304. The differential signal c1 is input to the third input terminal 301 via a capacitor 123 as a third impedance element. The differential signal c2 is input to the fourth input terminal 302 via a capacitor 124 as a fourth impedance element. The third input terminal 301 and the fourth input terminal 302 are short-circuited through a short-circuit line 303. The envelope detection circuit 300 outputs a second output signal e2 ($=2((c1+c2)/2)^2$) that is twice the value obtained by squaring the average of the differential signal c1 and the differential signal c2 from the second output terminal 304.

The envelope detection circuit 200 and the envelope detection circuit 300 have characteristics equal to each other. It is assumed that the capacitors 121 to 124 all have the same constant.

The envelope detection circuit 200 (or the envelope detection circuit 300) further includes a PMOS transistor 211 as a first field effect transistor, a PMOS transistor 212 as a second field effect transistor, a PMOS transistor 213 as a third field effect transistor, a PMOS transistor 214 as a fourth field effect transistor, and an NMOS transistor 216 constituting a signal addition section.

The differential signal c1 as the first input signal is input from the first input terminal 201 (or the third input terminal 301) to the gate terminal of the PMOS transistor 211 via the capacitor 121 (or the capacitor 123). The source terminal of the PMOS transistor 211 is connected to the power supply voltage line vdd as the first potential line. The differential signal c2 as the second input signal is input from the second input terminal 202 (or the fourth input terminal 302) to the gate terminal of the PMOS transistor 212 via the capacitor 122 (or the capacitor 124). The source terminal of the PMOS transistor 212 is connected to the power supply voltage line vdd as the first potential line. The source terminal of the PMOS transistor 213 is connected to the drain terminal of the PMOS transistor 211, and the gate terminal thereof is connected to a bias voltage terminal bs3 that supplies a predetermined potential. The source terminal of the PMOS transistor 214 is connected to the drain terminal of the PMOS transistor 212, and the gate terminal thereof is connected to the bias voltage terminal bs3.

The drain terminals of the PMOS transistor 213 and the PMOS transistor 214 are connected to the output line 215. The source terminal of the NMOS transistor 216 is connected to the ground potential line GND, the drain terminal thereof is connected to the output line 215, and the gate terminal thereof is connected to a bias voltage terminal bs2. The output line 215 is connected to the first output terminal 204 (or the second output terminal 304). The gate terminal of the PMOS transistor 211 is connected to a bias voltage terminal bs4 via a resistance 217. The gate terminal of the PMOS transistor 212 is connected to the bias voltage terminal bs4 via a resistance 218.

The differential circuit 600 includes a differential amplifier 601 that outputs differential output signals f1 and f2 from the first output signal e1 and the second output signal e2 and a differential amplifier 602 that outputs an output signal g from the differential output signals f1 and f2.

When the PMOS transistors 213 and 214 are biased by a voltage applied to the bias voltage terminal bs3 and are operating in the saturated region, drain currents Id1 and Id2 respectively flowing into the PMOS transistors 211 and 212 are as follows:

$$Id1=(\tfrac{1}{2})\beta(Vbs4+v1-Vt)^2 \tag{1}$$

$$Id2=(\tfrac{1}{2})\beta(Vbs4+v2-Vt)^2 \tag{2}$$

where v1 and v2 are the voltages of the differential signals c1 and c2, respectively; Vbs4 is the bias voltage applied to the bias voltage terminal bs4; Vt is the threshold voltage of the PMOS transistors 211 and 212; W is the channel width; L is the channel length; μ is the carrier mobility; C is the gate capacitance per unit area; and $\beta=\mu C(W/L)$ is the proportional constant. The total current of the drain currents Id1 and Id2 flows into a current source load as the NMOS transistor 216 and therefore can be converted to a large voltage signal to be extracted.

When v1=v0 and v2=−v0 on the assumption that the differential signals c1 and c2 are ideal balanced signals having no in-phase component, the following equation is given.

$$I0=Id1+Id2=\beta\{v0^2+(Vbs4-Vt)^2\} \tag{3}$$

The PMOS transistors 213 and 214 decrease the change of drain voltage of the PMOS transistors 211 and 212 and prevent the decrease of drain current of the PMOS transistors 211 and 212 through a phenomenon called channel length modulation, thereby acting to enhance the accuracy of Equation (3).

Since $(Vbs4-Vt)^2$ on the right side of Equation (3) is the DC component, when only the amount of change is extracted, the square value of the input signal v0 input to the envelope detection circuit 200 can be extracted. The DC component of $(Vbs4-Vt)^2$ can be easily removed by the capacitors 121 and 122. Therefore, the PMOS transistors 211 and 212 can be set in a region where they can stably operate without depending on the bias voltage Vbs4.

Since v0=G×vi where ±vi are the input signal voltages applied to the input terminals In1 and In2 of the LNA 100; vn is the in-phase noise component of the LNA 100 caused by the switching operation; and G is the voltage amplification of the LNA 100, the voltages v1 and v2 of the differential signals c1 and c2 output from the LNA 100 can be expressed as follows.

$$v1=vn+G\times vi=vn+v0 \tag{4}$$

$$v2=vn-G\times vi=vn-v0 \tag{5}$$

In this case, the drain current I0 of the NMOS transistor 216 of the envelope detection circuit 200 is expressed as follows.

$$I0=\beta\{v0^2+(Vb+vn-Vt)^2\} \tag{6}$$

The drain current I0 is converted to a voltage through the operation of the NMOS transistor 216, and the voltage is input to the differential amplifier 601. A voltage signal expressed by the following equation:

$$va1=Z\times I0=Z\times\beta\{v0^2+(Vb+vn-Vt)^2\} \tag{7}$$

where Z is the equivalent motional impedance of the NMOS transistor 216, is input to the differential amplifier 601.

In the envelope detection circuit 300, since the gate terminals of the PMOS transistors 211 and 212 are short-circuited through the short-circuit line 303, the average value ((v1+v2)/2)=vn of the differential signals c1 and c2 from the output lines 115 and 116 of the LNA 100 is applied to the gate terminals of the PMOS transistors 211 and 212 of the envelope detection circuit 300 via the capacitors 123 and 124. Therefore, the drain current Id of each of the PMOS transistors 211 and 212 of the envelope detection circuit 300 is expressed as follows.

$$Id=(\tfrac{1}{2})\beta(Vb+vn-Vt)^2 \tag{8}$$

Accordingly, the current flowing into the NMOS transistor 216 of the envelope detection circuit 300 is expressed as follows.

$$2\times Id=\beta(Vb+vn-Vt)^2 \tag{9}$$

The current signal 2×Id is converted to a voltage through the operation of the NMOS transistor 216, and the voltage is input to the differential amplifier 601. A voltage signal expressed by the following equation:

$$va2=2ZId=Z\beta(Vb+vn-Vt)^2 \tag{10}$$

where Z is the equivalent motional impedance of the NMOS transistor 216, is input to the differential amplifier 601.

The differential amplifier 601 amplifies the voltages va1 and va2 of Equation (7) and Equation (10) and outputs voltages va3 and va4 as the differential output signals f1 and f2. The voltages va1, va2, va3, and va4 are in the following relationship:

$$va3-va4 = Gs1(va2-va1) \tag{11}$$
$$= Gs1\times z\times\beta\times v0^2$$

$$va3+va4 = Gc1(va2+va1) \tag{12}$$
$$= Gc1\times z\times\beta\{2\times v0^2+(Vb+vn-Vt)^2\}$$

where Gc1 and Gs1 are respectively the in-phase gain and reverse-phase gain of the differential amplifier 601.

The voltages va3 and va4 are input to the differential amplifier 602 and converted from the differential signals to a single signal. As the output signal g, the differential amplifier 602 outputs a voltage va5 expressed by the following equation:

$$va5=Gs2(va3-va4)=Gs1\times Gs2\times Z\times\beta\times v0^2 \tag{13}$$

where Gs2 is the gain of the differential amplifier 602. That is, vn due to switching noises or the like is removed to obtain the square value of v0=G×vi.

With reference to FIG. 2, the case where the LNA 100 performs switching operation will be described.

As shown in FIG. 2, differential signals a1 and a2 indicating data "1" (with pulses) are first input during time points t0 to t1. When the voltage Vb to be applied to the input terminal bs0 is changed from the L level to the H level at the time point to, a noise n0 occurs in the differential signals c1 and c2 output by the LNA 100. The noise n0 also occurs in the first output signal e1 and the second output signal e2. Next, when the voltage Vb is changed from the H level to the L level for bringing the LNA 100 into a resting state during the time point t1 to a time point t2, a noise n1 occurs in the differential signals c1 and c2. The noise n1 also occurs in the first output signal e1 and the second output signal e2. Next, the differential signals a1 and a2 indicating data "0" (no pulse) are input during the time point t2 to a time point t3. When the voltage Vb to be applied to the input terminal bs0 is changed from the H level to the L level at the time point t2, a noise n2 occurs in the differential signals c1 and c2 output by the LNA 100. The noise n2 also occurs in the first output signal e1 and the second output signal e2.

The second output signal e2 is an output waveform of the envelope detection circuit 300 and is obtained by extracting only the noise component (in-phase component) of the differential signals c1 and c2 output to the output lines 115 and 116 of the LNA 100. The difference between the second output signal e2 and the first output signal e1 output from the envelope detection circuit 200 is extremely small as shown in FIG. 2. That is, most of the second output signal e2 is the noise component and is substantially overlapped with the first output signal e1 when plotting on an identical graph. In the electronic circuit 1, a large noise component can be removed to extract only a signal component. The first output signal e1 and the second output signal e2 are amplified by the differential amplifier 601 and output as the differential output signals f1 and f2. The differential amplifier 601 attenuates the in-phase component (noise) and amplifies the differential between the first output signal e1 and the second output signal e2. Therefore, the differential output signals f1 and f2 are smaller in amplitude than the first output signal e1 and the second output signal e2, and a slight difference can be seen as shown in FIG. 2. The output signal g is an output signal of the differential amplifier 602 and is obtained by amplifying and extracting only signal components of the differential output signals f1 and f2.

According to the embodiment described above, the following effects can be provided.

In the embodiment, it is possible to remove a large noise caused by the switching operation of the LNA 100 and extract only a signal component. This makes it possible to utilize the electronic circuit 1 for a device that requires an intermittent operation, such as a UWB-IR receiver, and to greatly reduce the power consumption of the electronic circuit 1. Further, since the electronic circuit 1 of the embodiment can be configured with field effect transistors, it can be made on-chip by an inexpensive CMOS semiconductor process. Especially since the electronic circuit 1 can operate at a high speed and a high frequency of about the limit frequency of field effect transistors, it can be applied to a system that is required to operate at a high speed, such as IR communication, without using an expensive, special semiconductor process. This makes it possible to realize a demodulation circuit or pulse detection circuit of a receiver that is easily integrated into a system.

Second Embodiment

Figure 3:
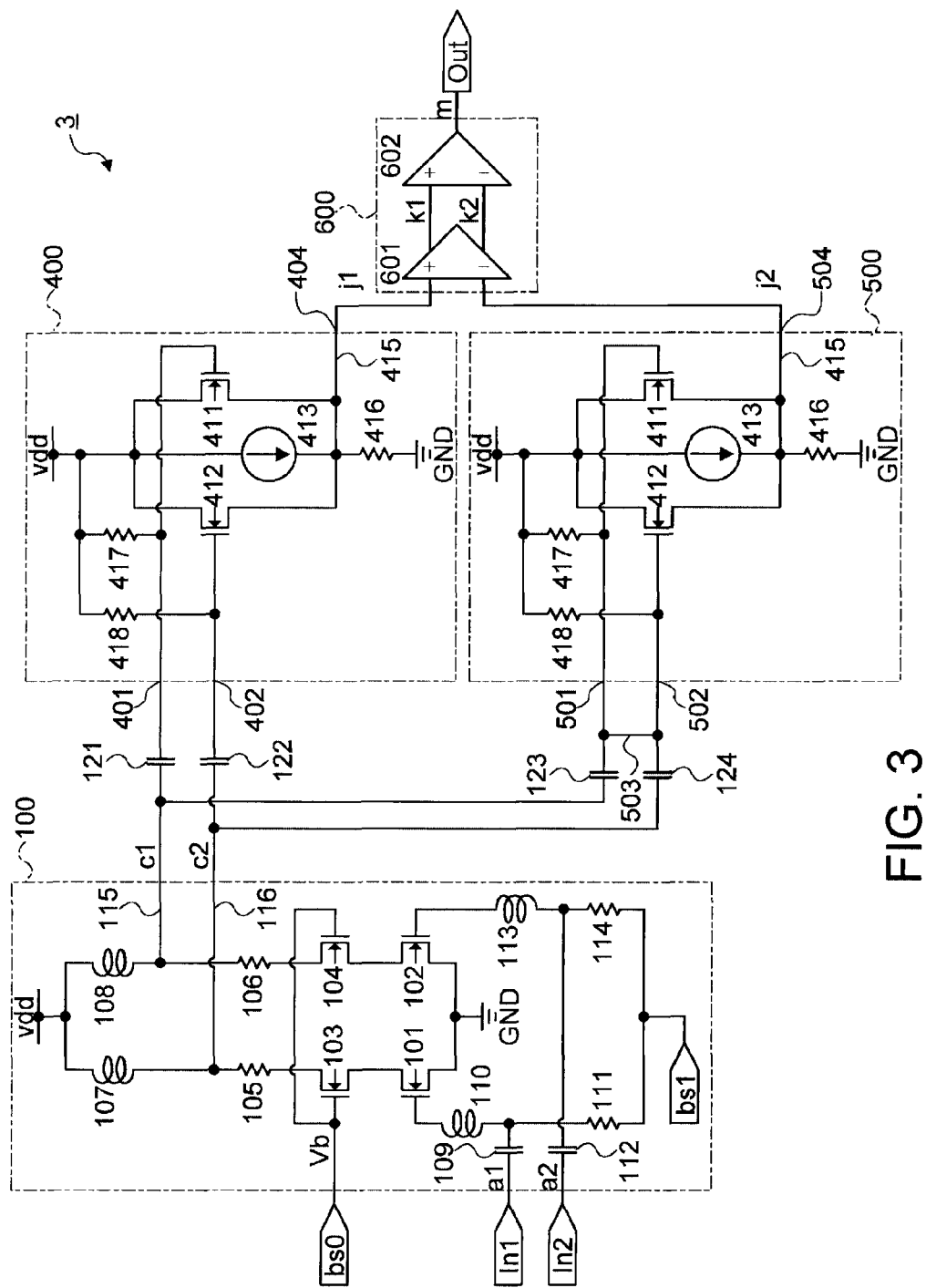
FIG. 3 is a circuit diagram showing the configuration of an electronic circuit according to a second embodiment.
Figure 4:
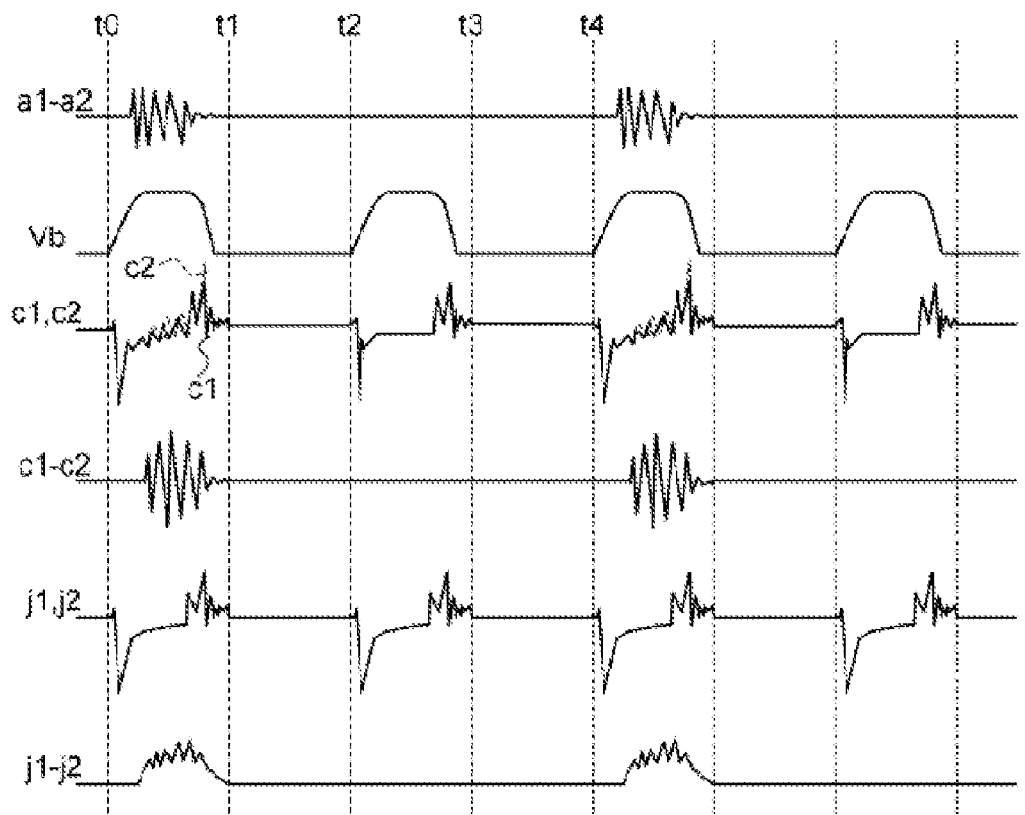
FIG. 4 is a waveform chart for explaining the operation of the electronic circuit according to the second embodiment.

Next, the configuration of an electronic circuit according to a second embodiment will be described with reference to FIGS. 3 and 4. FIG. 3 is a circuit diagram showing the configuration of the electronic circuit according to the second embodiment. FIG. 4 is a waveform chart for explaining the operation of the electronic circuit according to the second embodiment.

As shown in FIG. 3, an electronic circuit 3 includes the LNA 100, a first amplifier circuit 400, and a second amplifier circuit 500. Since the LNA 100 has been described in the first embodiment, the description thereof is omitted.

The first amplifier circuit 400 includes a first input terminal 401, a second input terminal 402, and a first output terminal 404. The differential signal c1 as the first input signal is input to the first input terminal 401 via the capacitor 121 as the first impedance element. The differential signal c2 as the second input signal is input to the second input terminal 402 via the capacitor 122 as the second impedance element. The first amplifier circuit 400 outputs from the first output terminal 404 a first output signal j1 that is obtained by comparing the voltage values of the differential signal c1 and the differential signal c2 to select one differential signal that has a higher voltage value and amplifying the selected signal.

The second amplifier circuit 500 includes a third input terminal 501, a fourth input terminal 502, and a second output terminal 504. The differential signal c1 is input to the third input terminal 501 via the capacitor 123 as the third impedance element. The differential signal c2 is input to the fourth input terminal 502 via the capacitor 124 as the fourth impedance element. The third input terminal 501 and the fourth input terminal 502 are short-circuited through a short-circuit line 503. The second amplifier circuit 500 outputs from the second output terminal 504 a second output signal j2 that is obtained by amplifying the average of the differential signal c1 and the differential signal c2.

The first amplifier circuit 400 and the second amplifier circuit 500 have characteristics equal to each other. It is assumed that the capacitors 121 to 124 all have the same constant.

The first amplifier circuit 400 (or the second amplifier circuit 500) further includes an NMOS transistor 411 as a first field effect transistor, an NMOS transistor 412 as a second field effect transistor, and a resistance 416 constituting a signal addition section.

The differential signal c1 as the first input signal is input from the first input terminal 401 (or the third input terminal 501) to the gate terminal of the NMOS transistor 411 via the capacitor 121 (or the capacitor 123). The drain terminal of the NMOS transistor 411 is connected to the power supply voltage line vdd as the first potential line. The differential signal c2 as the second input signal is input from the second input terminal 402 (or the fourth input terminal 502) to the gate terminal of the NMOS transistor 412 via the capacitor 122 (or the capacitor 124). The drain terminal of the NMOS transistor 412 is connected to the power supply voltage line vdd as the first potential line.

The source terminals of the NMOS transistor 411 and the NMOS transistor 412 are connected to an output line 415. The resistance 416 is connected to the ground potential line GND at one end and connected to the output line 415 at the other end. The output line 415 is connected to the first output terminal 404 (or the second output terminal 504). The gate terminal of the NMOS transistor 411 is connected to the power supply voltage line vdd via a resistance 417. The gate terminal of the NMOS transistor 412 is connected to the power supply voltage line vdd via a resistance 418. A current bias source 413 is connected between the power supply voltage line vdd and the output line 415.

In the first amplifier circuit 400 (or the second amplifier circuit 500), when the differential signals c1 and c2 are not input to the gate terminals of the NMOS transistors 411 and 412 via the capacitors 121 and 122 (or the capacitors 123 and 124), a DC voltage output to the first output terminal 404 (or the second output terminal 504) is VDD−Vt−Vov where VDD is the power supply voltage; Vt is the threshold voltage of the NMOS transistors 411 and 412; and Vov is the overdrive voltage required for causing the resistance 416 to generate the DC voltage. If the NMOS transistors 411 and 412 have the same characteristics, since the same power supply voltage VDD is applied to each of the gate terminals during rest, the NMOS transistors 411 and 412 are completely symmetrical to each other. Therefore, half the current flowing through the resistance 416 flows into each of the NMOS transistors 411 and 412. In the first amplifier circuit 400 (or the second amplifier circuit 500), the overdrive voltage Vov can be brought close to zero by increasing the resistance value of the resistance 416 or adjusting the current bias of the current bias source 413.

In the first amplifier circuit 400, when the differential signals c1 and c2 are input to the gate terminals of the NMOS transistors 411 and 412 via the capacitors 121 and 122, and when the gate potentials of the NMOS transistors 411 and 412 are increased, the potential of the first output terminal 404 is increased by the same amount as the increase in the gate potential. When the level of the differential signal c2 input to the gate terminal of the NMOS transistor 412 is lower than that of the differential signal c1 input to the gate terminal of the NMOS transistor 411, the voltage of the NMOS transistor 412 between the gate and source is lower than the threshold voltage Vt. The current flowing through the NMOS transistor 412 is zero. Therefore, the first amplifier circuit 400 buffer-amplifies the differential signal c1 input to the first input terminal 401 through the source follower of the NMOS transistor 411 and outputs the first output signal j1 from the first output terminal 404.

On the other hand, when the level of the differential signal c2 input to the second input terminal 402 is higher than that of the differential signal c1 input to the first input terminal 401, the first amplifier circuit 400 buffer-amplifies the differential signal c2 input to the second input terminal 402 and outputs the first output signal j1 from the first output terminal 404.

As described above, the first amplifier circuit 400 selects either the differential signals c1 or c2 input to the first input terminal 401 and the second input terminal 402, whichever has a higher signal level, and amplifies the selected signal through the operation to output as the first output signal j1.

In the above description, the overdrive voltage Vov is substantially zero. In the first amplifier circuit 400, when the differential signals c1 and c2 are extremely small signals, a signal corresponding to the sum of squares of the differential signals c1 and c2 input to the first input terminal 401 and the second input terminal 402 is to be output. The description for the operation in the case where the extremely small differential signals c1 and c2 are input is the same as in the first embodiment.

The second amplifier circuit 500 outputs the average of the differential signals c1 and c2. The second amplifier circuit 500 adopts the same circuit configuration as the first amplifier circuit 400 as much as possible for maintaining the symmetry property with respect to the first amplifier circuit 400 and improving the performance of removing a noise component. The difference between the first amplifier circuit 400 and the second amplifier circuit 500 is that the gate terminals of the NMOS transistor 411 and the NMOS transistor 412 are short-circuited through the short-circuit line 503 in the second amplifier circuit 500. The voltages of the differential signals c1 and c2 input to the third input terminal 501 and the fourth input terminal 502 are divided and applied to the gate terminals of the NMOS transistor 411 and the NMOS transistor 412 via the capacitors 123 and 124. When the capacitors 123 and 124 and the resistances 417 and 418 have the same constant, the voltage has the average value of the two input signals. The average of the differential signals c1 and c2 output from the output lines 115 and 116 of the LNA 100 is output to the second output terminal 504 as the second output signal j2.

The differential circuit 600 includes the differential amplifier 601 that outputs differential output signals k1 and k2 from the first output signal j1 and the second output signal j2 and the differential amplifier 602 that outputs an output signal m from the differential output signals k1 and k2.

The electronic circuit 3 can remove noise caused by the switching operation of the LNA 100 with the first amplifier circuit 400, the second amplifier circuit 500, and the differential circuit 600.

The differential signals a1 and a2 (potential ±vi) input to the LNA 100 are first amplified and output to the output lines 115 and 116 as the differential signals c1 and c2. In this case, since an in-phase component vc due to the switching operation is added, the potentials of the differential signals c1 and c2 are vc±vi (the gain of the LNA 100 is omitted here).

Since the first amplifier circuit 400 selects either the differential signals c1 or c2, whichever has a higher signal level, the potential of the first output signal j1 output from the first output terminal 404 is vc+|vi|. Since the second amplifier circuit 500 obtains the average of the differential signals c1 and c2, vc is output as the second output signal j2. When the difference between the first output signal j1 and the second output signal j2 is obtained by the differential amplifiers 601 and 602, the absolute value |vi| of potentials of the differential signals a1 and a2 can be correctly detected. This is a waveform obtained by full-wave rectifying the differential signals a1 and a2 input to the LNA 100, and the signal detection can be simultaneously performed.

With reference to FIG. 4, the case where the LNA 100 performs the switching operation will be described.

As shown in FIG. 4, a1-a2 shows the difference between the differential signals a1 and a2 input to the input terminals In1 and In2 of the LNA 100. The voltage Vb is input to the input terminal bs0 for causing the LNA 100 to perform the switching operation in accordance with the presence of the differential signals a1 and a2. The differential signals c1 and c2 are output signals output to the output lines 115 and 116 of the LNA 100. Since a large in-phase component due to the switching operation is superimposed as noise on the output differential signals c1 and c2, the signal component can hardly be determined.

c1-c2 is a signal component extracted by obtaining the difference between the differential signals c1 and c2, which is shown as reference. A noise component can be removed by obtaining the difference between the differential signals c1 and c2 by a differential amplifier circuit. However, since the differential signals a1 and a2 to be input are modulated high-frequency waves, that is, RF (Radio Frequency) signals, it is difficult to form the differential amplifier that consumes low power and is stable.

The first output signal j1 and the second output signal j2 contain the large noise component vc, and the differential signals a1 and a2 are almost lost. j1−j2 shows the difference between the first output signal j1 and the second output signal j2. The differential circuit 600 can remove the vc contained in the first output signal j1 and extract |vi|. In this case, since a signal frequency component contained in the j1−j2 is at baseband at most, it is easy to configure a low-frequency differential circuit 600 that corresponds to the baseband, is stable, and consumes low power.

The second embodiment has been described in which either the differential signals c1 or c2 input to the first amplifier circuit 400, whichever has a higher level, is selected and output. However, even when the circuit is configured so as to select and output either the differential signals c1 or c2, whichever has a lower input signal level, it can operate completely in the same manner. In this case, the output of the first amplifier circuit 400 is vc−|vi|. However, by obtaining the difference between the output of the first amplifier circuit 400 and the output of the second amplifier circuit 500, |vi| can be correctly detected. This can be realized by using PMOS transistors instead of the NMOS transistors 411 and 412 in the first amplifier circuit 400 and the second amplifier circuit 500.

According to the embodiment described above, the following effects can be provided.

In the embodiment, the large noise caused by the switching operation of the LNA 100 can be removed to extract only a signal component. This makes it possible to utilize the electronic circuit for a device that requires an intermittent operation, such as a UWB-IR receiver, and to greatly reduce the power consumption of the electronic circuit 3. Further, since the electronic circuit 3 of the embodiment can be configured with field effect transistors, it can be made on-chip by an inexpensive CMOS semiconductor process. Especially since the electronic circuit 3 can operate at a high speed and a high frequency of about the limit frequency of field effect transistors, it can be applied to a system that is required to operate at a high speed, such as IR communication, without using an expensive, special semiconductor process. This makes it possible to realize a demodulation circuit or pulse detection circuit of a receiver that is easily integrated into a system.

Third Embodiment

Figure 5:
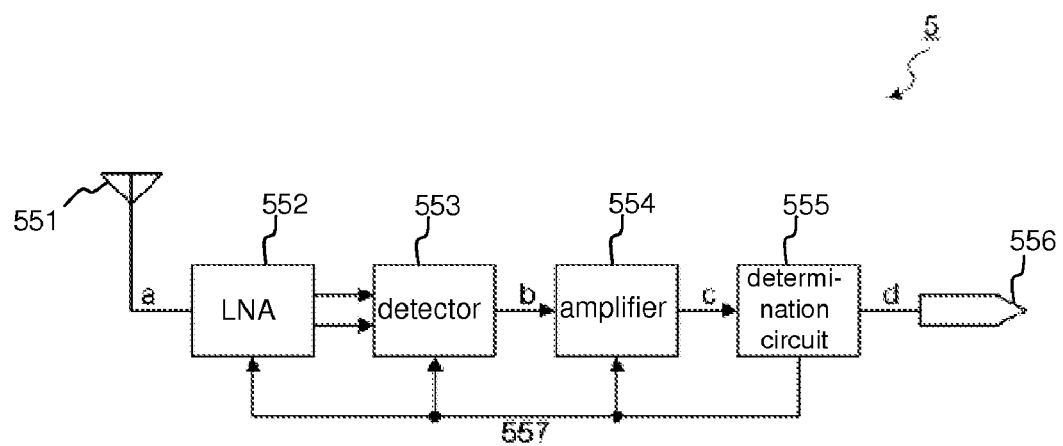
FIG. 5 is a circuit diagram showing the configuration of a receiver according to a third embodiment.
Figure 6:
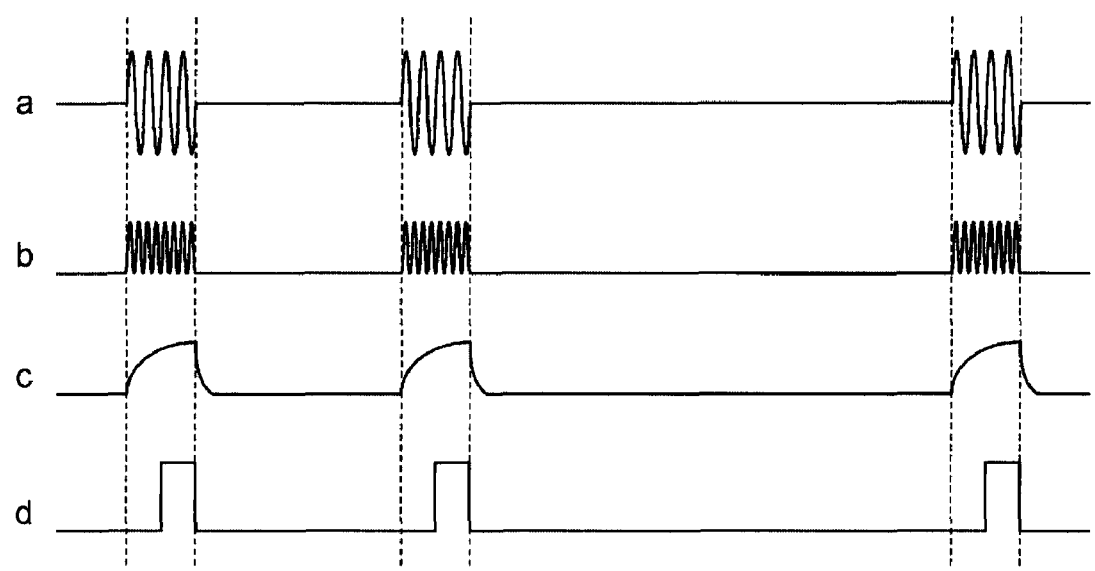
FIG. 6 is a timing diagram showing the operation of the receiver according to the third embodiment.
Figure 7:
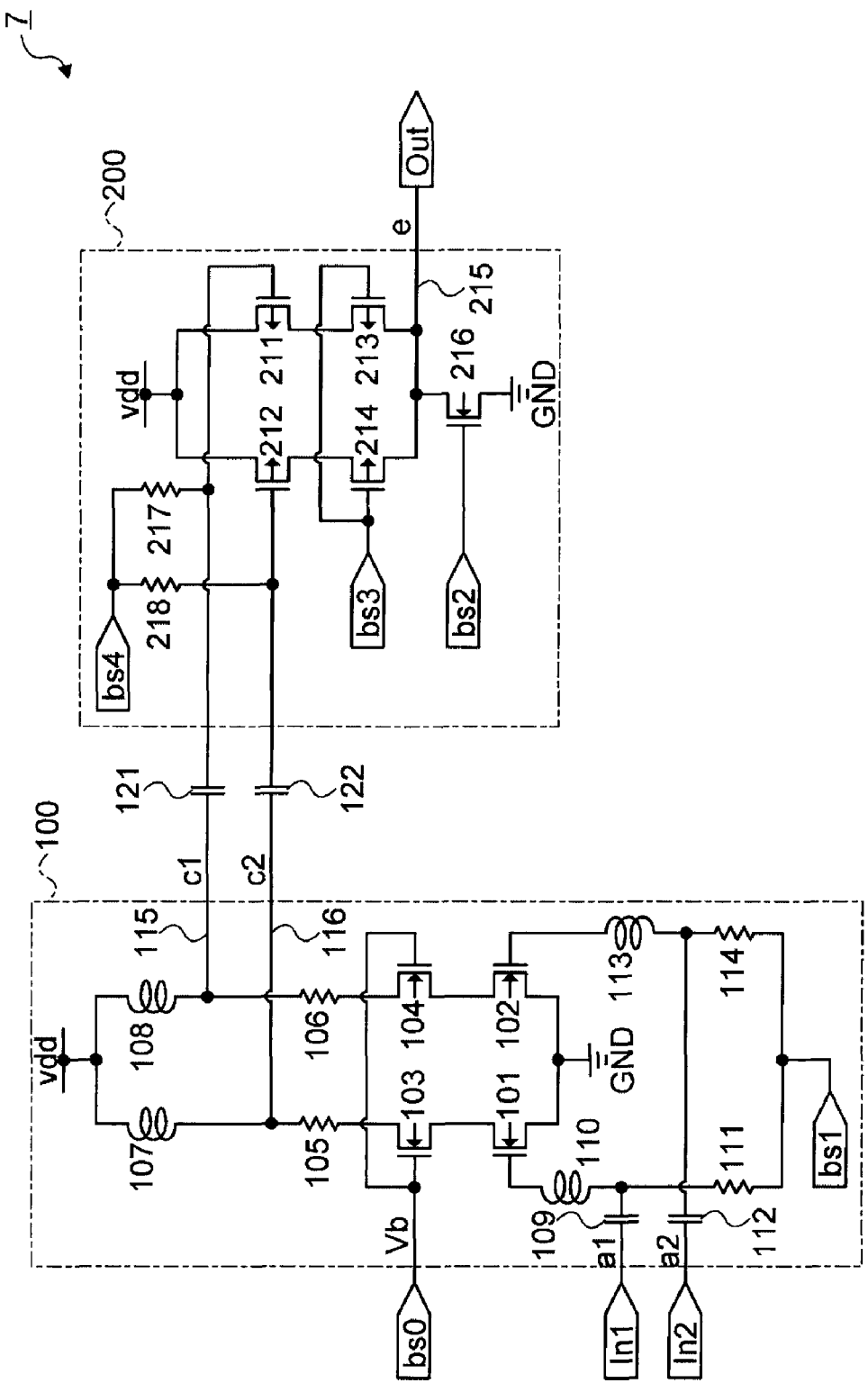
FIG. 7 is a circuit diagram showing the configuration of a related-art electronic circuit.
Figure 8:
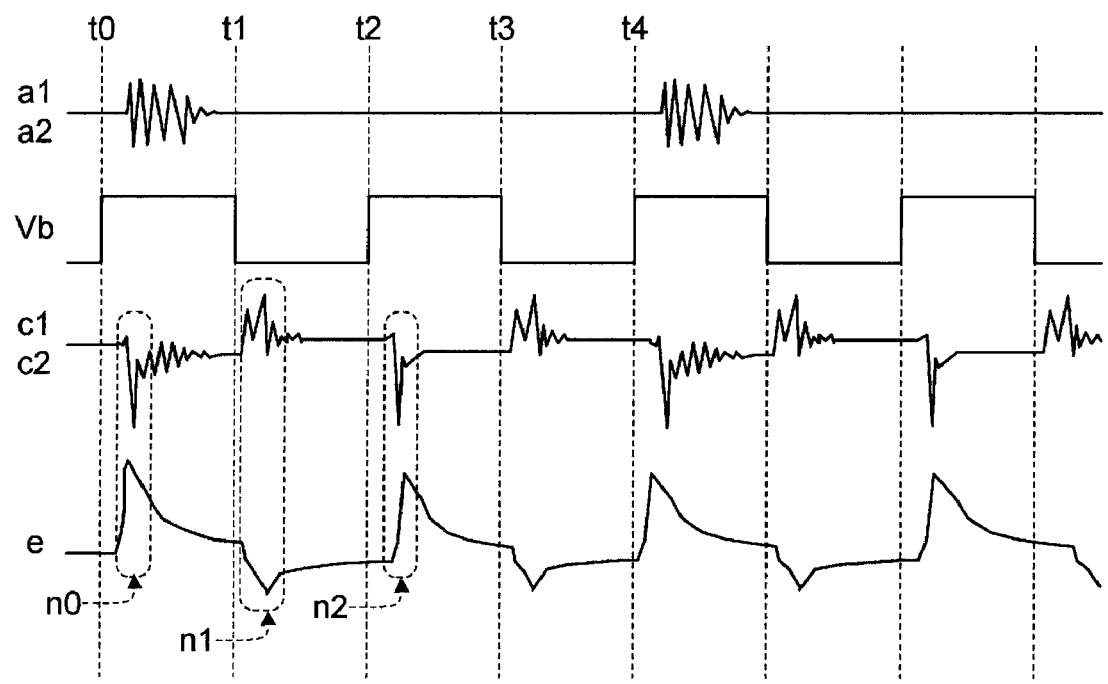
FIG. 8 is a waveform chart for explaining the operation of the related-art electronic circuit.

Next, the configuration of a receiver as an electronic device including an electronic circuit according to a third embodiment will be described with reference to FIGS. 5 and 6. FIG. 5 is a circuit diagram showing the configuration of the receiver according to the third embodiment. FIG. 6 is a timing diagram showing the operation of the receiver according to the third embodiment.

In the third embodiment, although a case will be described as an example in which a waveform that is obtained by multiplying a rectangular pulse by the sine wave of a carrier frequency fc and shown by a reception signal a in FIG. 6 is used as a UWB-IR pulse signal, this is not restrictive. Gaussian Monopulse or Hermite Pulse that is frequently used as an IR signal, n-order differential waveforms (n being a natural number) of them, pulses obtained by multiplying them by the sine wave of the carrier frequency fc and shifting the spectrum on a frequency axis, or other pulses may be used. Especially the pulse obtained by the multiplication by the sine wave of the carrier frequency fc is frequently used because it does not contain a DC component, and the spectrum is symmetric about the carrier frequency fc. In the third embodiment, a UWB-IR receiver (electronic device) that uses as an IR signal a pulse that can be obtained by multiplying the simplest rectangular pulse by the sine wave (a in FIG. 6) will be described as an example.

As shown in FIG. 5, a receiver 5 includes an antenna 551, a low noise amplifier (LNA) 552, a detector circuit 553 composed of the electronic circuit 1 (FIG. 1) or the electronic circuit 3 (FIG. 3), an amplifier circuit 554, and a determination circuit 555 as a signal processing section.

The reception signal a (FIG. 6) received by the antenna 551 is amplified by the LNA 552 and has balanced outputs. The detector circuit 553 is the circuit that outputs the square of an input signal with the envelope detection circuit 200, the envelope detection circuit 300, and the differential circuit 600 shown in the first embodiment, or the circuit that outputs the absolute value of a signal with the first amplifier circuit 400, the second amplifier circuit 500, and the differential circuit 600 shown in the second embodiment, performing square-law detection or envelope detection.

b in FIG. 6 schematically shows the square or absolute value of the reception signal a. The high frequency component of the signal is actually attenuated due to the frequency response of the constituent circuit, so that the signal becomes like the g in FIG. 2 or the j1–j2 in FIG. 4. The amplifier circuit 554 amplifies the signal to such a level that the determination circuit 555 can determines the signal. The amplifier circuit 554 also performs the operation (c in FIG. 6) for removing the high frequency component contained in the signal if needed.

The determination circuit 555 can performs the binarizing processing of the output signal c of the amplifier circuit 554, output a binarized signal d (d in FIG. 6) from an output terminal 556, and detect the presence or absence of pulses. The determination circuit 555 can predict a time when the next signal will be sent based on the timing of receiving the signal. With this prediction, a signal 557 is generated to stop the operation of the LNA 552, the detector circuit 553, and the amplifier circuit 554 when not needed, so that the power consumption of the receiver 5 can be reduced. The influence of switching noises caused in this case can be removed by the detector circuit 553.

The method for stopping the operation when not needed has been exemplified in the LNA 100 in the first and second embodiments. In the same manner, the operation of the detector circuit 553 and the amplifier circuit 554 can also be stopped by controlling the bias voltage or arranging switches in series to a power supply line to directly control the switching, so that the power consumption can be saved.

In UWB-IR, when the transmission or non-transmission of pulses is controlled in accordance with the bit 1 or 0 of information to be transmitted, the modulation method is called OOK (On-Off-Keying); whereas when the position of pulses is controlled in accordance with transmission bit information, the modulation method is called PPM (Pulse Position Modulation). In the configuration of the receiver 5, since the presence or absence of transmitted pulses or the position of the pulses can be detected, the demodulation can be performed in UWB-IR.

By using the electronic circuit 1 in the first embodiment or the electronic circuit 3 in the second embodiment, a UWB-IR receiver 5 can be easily configured. Any of the circuits used in the receiver 5 can be integrated by using a CMOS semiconductor integrated circuit, so that a receiver with high reliability at low cost can be realized.

In the embodiment, since the influence of the noise caused by switching at this time can be removed, a receiver with low power consumption and high performance can be configured with a simple circuit configuration.

The entire disclosure of Japanese Patent Application No. 2008-300526, filed Nov. 26, 2008 is expressly incorporated by reference herein.

What is claimed is:

1. An electronic circuit comprising:
a circuit that generates a first input signal and a second input signal that are balanced differential signals;
a first envelope detection circuit that includes a first input terminal, a second input terminal, and a first output terminal, the first input signal being input to the first input terminal via a first impedance element, the second input signal being input to the second input terminal via a second impedance element, and outputs from the first output terminal a first output signal that is a sum of the square of the first input signal and the square of the second input signal;
a second envelope detection circuit that includes a third input terminal, a fourth input terminal, and a second output terminal, the first input signal being input to the third input terminal via a third impedance element, the second input signal being input to the fourth input terminal via a fourth impedance element, and outputs from the second output terminal a second output signal that is twice a value obtained by squaring the average of the first input signal and the second input signal; and a differential circuit that generates a differential signal from the first output signal and the second output signal.

2. The electronic circuit according to claim 1, wherein the first envelope detection circuit and the second envelope detection circuit have characteristics equal to each other, and each includes a first field effect transistor to whose gate terminal the first input signal is input and whose source terminal is connected to a first potential line, a second field effect transistor to whose gate terminal the second input signal is input and whose source terminal is connected to the first potential line, a third field effect transistor whose source terminal is connected to a drain terminal of the first field effect transistor and whose gate terminal is biased to a predetermined potential, a fourth field effect transistor whose source terminal is connected to the drain terminal of the second field effect transistor and whose gate terminal is biased to the predetermined potential, and an output line that connects the drain terminal of the third field effect transistor with the drain terminal of the fourth field effect transistor to output an output signal, and the second envelope detection circuit is short-circuited between the third input terminal and the fourth input terminal through a short-circuit line.

3. An electronic device comprising an electronic circuit according to claim 1.

4. The electronic device according to claim 3, further comprising a signal processing section that detects pulses carried by a supplied UWB signal.

5. The electronic device according to claim 4, further comprising a circuit portion to which power is supplied only when a UWB signal is present in at least a part thereof, and a switch circuit therefor.

6. An electronic circuit comprising:

a circuit that generates a first input signal and a second input signal that are balanced differential signals;

a first amplifier circuit that includes a first input terminal, a second input terminal, and a first output terminal, the first input signal being input to the first input terminal via a first impedance element, the second input signal being input to the second input terminal via a second impedance element, and outputs from the first output terminal a first output signal that is obtained by comparing the first input signal and the second input signal to select the larger one and amplifying the selected signal;

a second amplifier circuit that includes a third input terminal, a fourth input terminal, and a second output terminal, the first input signal being input to the third input terminal via a third impedance element, the second input signal being input to the fourth input terminal via a fourth impedance element, outputs from the second output terminal a second output signal that is obtained by amplifying the average of the first input signal and the second input signal, and has characteristics equal to those of the first amplifier circuit; and a differential circuit that generates a differential signal from the first output signal and the second output signal.

7. The electronic circuit according to claim 6, wherein the first amplifier circuit and the second amplifier circuit have characteristics equal to each other, and each includes a first field effect transistor to whose gate terminal the first input signal is input and whose drain terminal is connected to a first potential line, a second field effect transistor to whose gate terminal the second input signal is input and whose drain terminal is connected to the first potential line, and an output line that connects the source terminal of the first field effect transistor with the source terminal of the second field effect transistor to output an output signal, and the second amplifier circuit is short-circuited between the third input terminal and the fourth input terminal through a short-circuit line.

\* \* \* \* \*